(12) United States Patent
Chen et al.

(10) Patent No.: US 11,133,418 B2
(45) Date of Patent: Sep. 28, 2021

(54) SEMICONDUCTOR DEVICE AND METHOD FOR FABRICATING THE SAME

(71) Applicant: United Microelectronics Corp., Hsinchu (TW)

(72) Inventors: Yen-Chen Chen, Tainan (TW); Xiao Wu, Singapore (SG); Hai Tao Liu, Singapore (SG); Ming Hua Du, Singapore (SG); Shouguo Zhang, Singapore (SG); Yao-Hung Liu, Tainan (TW); Chin-Fu Lin, Tainan (TW); Chun-Yuan Wu, Yunlin County (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 16/413,425

(22) Filed: May 15, 2019

(65) Prior Publication Data
US 2019/0267492 A1    Aug. 29, 2019

Related U.S. Application Data

(62) Division of application No. 15/637,773, filed on Jun. 29, 2017, now Pat. No. 10,340,391.

(51) Int. Cl.
*H01L 29/786*    (2006.01)
*H01L 29/24*    (2006.01)
(Continued)

(52) U.S. Cl.
CPC .......... *H01L 29/7869* (2013.01); *H01L 29/24* (2013.01); *H01L 29/41733* (2013.01); *H01L 29/45* (2013.01); *H01L 29/66969* (2013.01)

(58) Field of Classification Search
CPC ............... H01L 29/786; H01L 29/7869; H01L 29/78693; H01L 29/45; H01L 29/485; H01L 29/66969; H01L 29/41733
See application file for complete search history.

(56) References Cited

U.S. PATENT DOCUMENTS 5,936,831 A    8/1999 Kola et al.
6,534,394 B1    3/2003 Cooney, III et al.
(Continued)

FOREIGN PATENT DOCUMENTS

CN    102005411    4/2011

OTHER PUBLICATIONS

Zenglin Wang, Osamu Yaegashi, Hiroyuki Sakaue, Takayuki Takahagi, and Shoso Shingubara; Suppression of native oxide growth in sputtered TaN films and its application to Cu electroless plating; Journal of Applied Physics 2003 94:7, 4697-4701 (Year: 2003).*
(Continued)

*Primary Examiner* — Mohammed Shamsuzzaman
*Assistant Examiner* — Aaron J Gray
(74) *Attorney, Agent, or Firm* — J.C. Patents

(57) ABSTRACT

A semiconductor device includes an oxide semiconductor layer, disposed over a substrate. A source electrode of a metal nitride is disposed on the oxide semiconductor layer. A drain electrode of the metal nitride is disposed on the oxide semiconductor layer. A metal-nitride oxidation layer is formed on a surface of the source electrode and the drain electrode. A ratio of a thickness of the metal-nitride oxidation layer to a thickness of the drain electrode or the source electrode is equal to or less than 0.2.

8 Claims, 3 Drawing Sheets

(51) Int. Cl.
*H01L 29/66* (2006.01)
*H01L 29/45* (2006.01)
*H01L 29/417* (2006.01)

(56) References Cited

U.S. PATENT DOCUMENTS

| | | |
|---|---|---|
| 8,961,814 B2 | 2/2015 | Van Duren et al. |
| 2011/0227074 A1 | 9/2011 | Kato et al. |
| 2013/0134415 A1* | 5/2013 | Godo ................ H01L 29/7869 |
| | | 257/43 |
| 2013/0207101 A1 | 8/2013 | Yamazaki et al. |
| 2014/0103340 A1* | 4/2014 | Yamazaki ......... H01L 21/02631 |
| | | 257/43 |
| 2014/0131702 A1 | 5/2014 | Matsubayashi et al. |
| 2014/0287561 A1 | 9/2014 | Liu et al. |
| 2015/0041799 A1 | 2/2015 | Morooka |
| 2015/0179810 A1 | 6/2015 | Yamazaki et al. |
| 2015/0279674 A1 | 10/2015 | Cho et al. |
| 2016/0247832 A1* | 8/2016 | Suzawa ............. H01L 29/78696 |

OTHER PUBLICATIONS

Zenglin Wang, et al., "Suppression of native oxide growth in sputtered TaN films and its application to Cu electroless plating," Journal of Applied Physics, vol. 94, Oct. 2003, pp. 1-6.

* cited by examiner

SEMICONDUCTOR DEVICE AND METHOD FOR FABRICATING THE SAME

CROSS REFERENCE TO RELATED APPLICATION

This application is a divisional application of and claims the priority benefit of U.S. application Ser. No. 15/637,773, filed on Jun. 29, 2017, now allowed. The entirety of the above-mentioned patent application is hereby incorporated by reference herein and made a part of specification.

BACKGROUND

1. Field of the Invention

The present invention generally relates to semiconductor fabrication, and particularly to a semiconductor device, such as thin film transistor (TFT).

2. Description of Related Art

An electronic circuit is usually fabricated by semiconductor fabrication technology to form an integrated circuit. The electronic circuit usually includes a large amount of field effect transistors (FETs). The performance and the size of the transistors would also determine the performance and the size of the electronic circuit.

As to the development on design of transistor, the TFT has been proposed to as one of popular transistors. In TFT, the source electrode and the drain electrode of the TFT are formed by a semiconductor layer over the substrate instead of being formed formation in silicon substrate. The material of the semiconductor layer for forming the source electrode and the drain electrode can be metal nitride, such as the tantalum nitride (TaN).

Further, the channel used in the newly developed TFT may be formed by oxide semiconductor such as In—Ga—Zn—O (IGZO) or the similar materials, like In—Zn—O (IZO), In—Ga—O (IGO), Zn—Sn—O (ZTO), In—Sn—Zn—O (ITZO), Hf—In—Zn—O (HIZO), or Al—Zn—Sn—O (AZTO).

The source electrode and the drain electrode are formed on the oxide semiconductor, in which the channel of the TFT as a part of the oxide semiconductor is formed between the source electrode and the drain electrode. In other words, the distance between the source electrode and the drain electrode would determine the channel length.

When the channel length in design is reduced, the distance between the source electrode and the drain electrode is reduced, accordingly, and a trench with high aspect ratio would be formed. The high aspect ratio would cause the difficulty to form the gate structure subsequently, about filling into the trench between the source electrode and the drain electrode. Even further, the source electrode and drain electrode of metal nitride, such as TaN, are easily oxidized as the native oxide. The native oxide would further reduce the channel length as not intended, which may cause the malfunction of the TFT.

The design for the TFT is still at least an issue to be considered in fabricating the TFT.

SUMMARY OF THE INVENTION

The invention provides a semiconductor device. The semiconductor comprises an oxide semiconductor layer, disposed over a substrate. A source electrode of a metal nitride is disposed on the oxide semiconductor layer. A drain electrode of the metal nitride is disposed on the oxide semiconductor layer. A metal-nitride oxidation layer is formed on a surface of the source electrode and the drain electrode. A ratio of a thickness of the metal-nitride oxidation layer to a thickness of the drain electrode or the source electrode is equal to or less than 0.2.

In an embodiment, the semiconductor device further comprises a gate electrode, disposed over the substrate and a gate dielectric layer, disposed on the gate electrode, wherein the oxide semiconductor layer is disposed on the gate dielectric layer.

In an embodiment, as to the semiconductor device, it further comprises an oxidation layer at a bottom of the drain electrode and the source electrode in contact with the oxide semiconductor layer, wherein the thickness of the metal-nitride oxidation layer is larger than a thickness of the oxidation layer.

In an embodiment, as to the semiconductor device, a distance between the source electrode and the drain electrode is in a range of 30 nm to 80 nm.

In an embodiment, as to the semiconductor device, the thickness of the metal-nitride oxidation layer is less than 7 nm.

In an embodiment, as to the semiconductor device, the metal nitride is TaN.

In an embodiment, as to the semiconductor device, the oxide semiconductor layer comprises InGaZnO (IGZO), In—Zn—O (IZO), In—Ga—O (IGO), Zn—Sn—O (ZTO), In—Sn—Zn—O (ITZO), Hf—In—Zn—O (HIZO), or Al—Zn—Sn—O (AZTO).

In an embodiment, as to the semiconductor device, the metal-nitride oxidation layer is a native oxide layer.

In an embodiment, a semiconductor device comprises an oxide semiconductor layer, disposed over a substrate. A metal nitride layer is disposed on the oxide semiconductor layer. A metal-nitride oxidation layer is formed on a surface of the metal nitride layer. A ratio of a thickness of the metal-nitride oxidation layer to a thickness of the metal nitride layer is equal to or less than 0.2.

In an embodiment, as to the semiconductor device, it further comprises an oxidation layer at a bottom of the metal nitride layer in contact with the oxide semiconductor layer, wherein the thickness of the metal-nitride oxidation layer is larger than a thickness of the oxidation layer.

In an embodiment, a method for fabricating a semiconductor device comprises forming an oxide semiconductor layer, over a substrate. Then, a metal nitride layer is formed over the oxide semiconductor layer, wherein a metal plasma is provided under control by a power range of 5 kw to 15 kw and flashing $N_2$. The metal nitride layer is patterned to form a source electrode and a drain electrode of a metal nitride. A metal-nitride oxidation layer is formed on a surface of the source electrode and the drain electrode.

In an embodiment, as to the method, the $N_2$ is flashed by a range of 30 sccm to 50 sccm.

In an embodiment, as to the method, a ratio of a thickness of the metal-nitride oxidation layer to a thickness of the drain electrode or the source electrode is equal to or less than 0.2.

In an embodiment, the method further comprises forming a gate electrode over the substrate, and forming a gate dielectric layer on the gate electrode, wherein the oxide semiconductor layer is disposed on the gate dielectric layer.

In an embodiment, as to the method, it further comprises forming an oxidation layer at a bottom of the source electrode and the drain electrode in contact with the oxide semiconductor layer, wherein a thickness of the metal-nitride oxidation layer is larger than a thickness of the oxidation layer.

In an embodiment, as to the method, a gap between the source electrode and the drain electrode is in a range of 30 nm to 80 nm.

In an embodiment, as to the method, the thickness of the metal-nitride oxidation layer is less than 7 nm.

In an embodiment, as to the method, the metal plasma is Ta plasma, so to form the metal nitride by TaN.

In an embodiment, as to the method, the oxide semiconductor layer comprises InGaZnO (IGZO), In—Zn—O (IZO), In—Ga—O (IGO), Zn—Sn—O (ZTO), In—Sn—Zn—O (ITZO), Hf—In—Zn—O (HIZO), or Al—Zn—Sn—O (AZTO).

In an embodiment, as to the method, the step of forming the metal-nitride oxidation layer is a native oxidation.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The invention is directed to semiconductor device about TFT, which has better quality to effectively maintain the channel length and easily form the gate electrode subsequently.

There are various TFT having been proposed. The invention is directed to the TFT, or even a stacked structure, to effectively maintain the channel length and easily form the gate electrode subsequently in an example of the TFT.

Several embodiments are provided for describing the invention but the invention is not limited to the embodiments as provided.

The invention can be applied in a semiconductor device such as the TFT. The TFT can also be designed in various, such as a single-gate TFT or even the dual-gate TFT.

Figure 1:
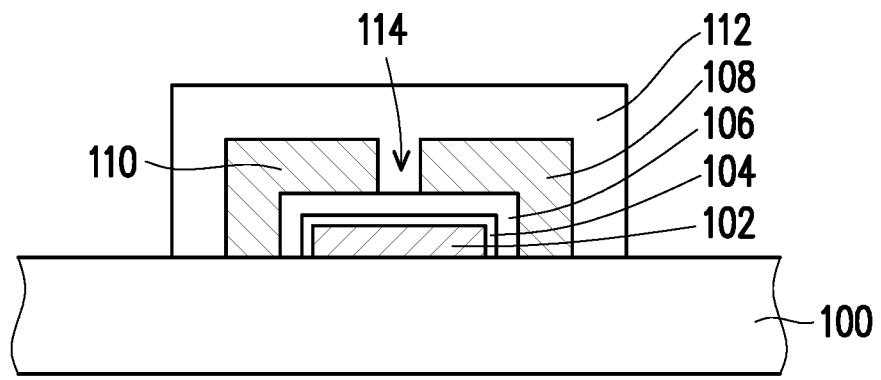
FIG. 1 is a drawing, schematically illustrating a cross-sectional view of a TFT, according to an embodiment of the invention.

FIG. 1 is a drawing, schematically illustrating a cross-sectional view of a TFT, according to an embodiment of the invention. Referring to FIG. 1, in an example, the invention can be applied to a single-gate TFT in an example. The single-gate TFT in an embodiment can include a gate electrode 102 formed on a substrate 100. A gate insulating layer 104 is formed over the gate electrode 102. An oxide semiconductor layer 106 is formed over the gate insulating layer 104. A source electrode 108 and a drain electrode layer 110 are formed over the substrate 100, on the oxide semiconductor layer 106. A passivation layer 112 is formed over the source electrode 108 and the drain electrode 110, wherein the passivation layer 112 also fills into the trench 114 between the source electrode 108 and the drain electrode 110. The trench 114 in cross-section view is also realized as a gap to define the channel of the TFT in the oxide semiconductor layer 106.

Figure 3:
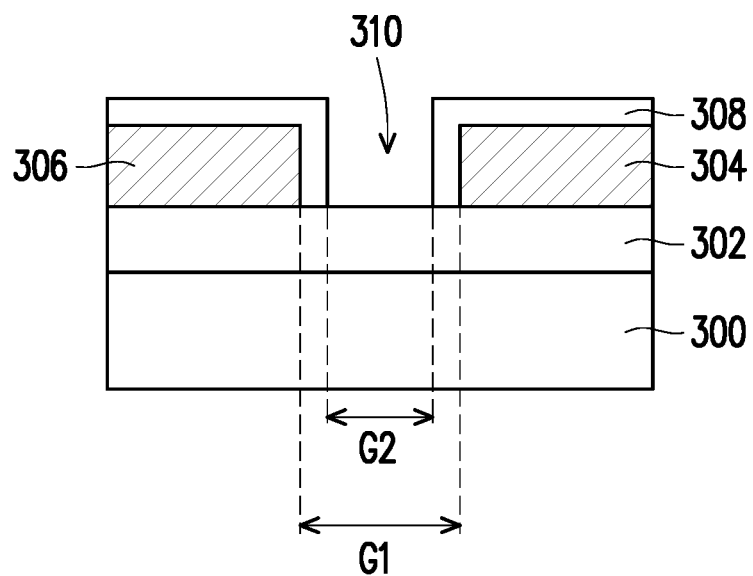
FIG. 3 is a drawing, schematically illustrating a cross-sectional view of a part of the TFT relating to the source electrode and the drain electrode, according to an embodiment of the invention.

However, if the device size is greatly reduced in recently development several issues relating to the trench 114 due to native oxidation on source electrode 108 and the drain electrode 110 would occur as to be described by better detail in FIG. 3.

Figure 2:
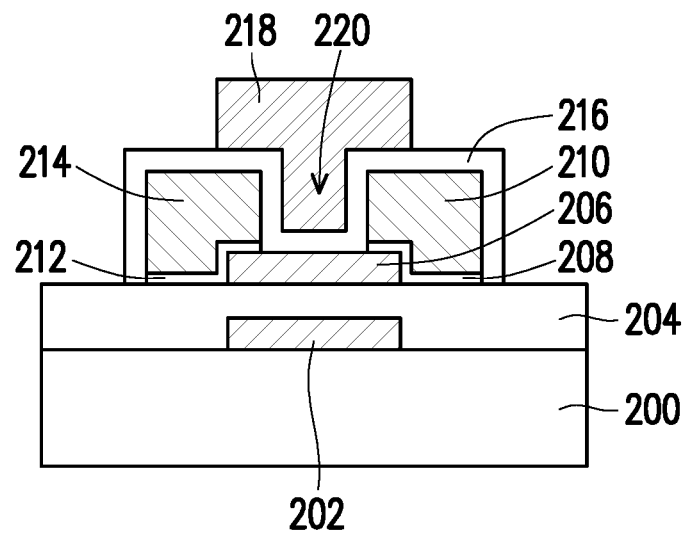
FIG. 2 is a drawing, schematically illustrating a cross-sectional view of a TF, according to an embodiment of the invention.

Another type of TFT can be applied by the invention in an example is the dual-gate TFT. FIG. 2 is a drawing, schematically illustrating a cross-sectional view of a TF, according to an embodiment of the invention.

Referring to FIG. 2. a first gate electrode 202 is formed on a substrate 200. An insulating layer 204 is formed over the substrate 200 and the first gate electrode 202. An oxide semiconductor layer 206 is formed on the insulating layer 202. The antioxidant films 208, 212 are formed on the oxide semiconductor layer 206 at two sides, which are also used to define the channel of the TFT. A source electrode 210 and a drain electrode 214 are disposed on the antioxidant films. A gate insulating layer 216 is formed over the substrate 200 on the source electrode 210, a drain electrode 214 and the exposed portion of the oxide semiconductor layer 206. Then gate electrode 218 is formed on the gate insulating layer 216, over the source electrode 210, the drain electrode 214, and the exposed portion of the oxide semiconductor layer 206.

As noted, the trench 220 in cross-section view is also formed between the source electrode 210 and the drain electrode 214. The channel of the TFT is formed in the oxide semiconductor layer 206 under the trench 220.

In further embodiments, the material for the source electrode 108, 210 and the drain electrode 110, 214 can be the metal nitride, such as TaN. The material for the oxide semiconductor layer 206 can be InGaZnO (IGZO), In—Zn—O (IZO), In—Ga—O (IGO), Zn—Sn—O (ZTO), In—Sn—Zn—O (ITZO), Hf—In—Zn—O (HIZO), or Al—Zn—Sn—O (AZTO). The oxide semiconductor layer 206 is used to form the channel in the TFT structure.

The structures of TFT in FIG. 1 and FIG. 2 as the examples, the source electrode 108, 210 and the drain electrode 110, 214 are made of TaN, which would be oxidized natively during the subsequent various process. The oxidation on the metal nitride for the source electrode 108, 210 and the drain electrode 110, 214 would cause several issues.

FIG. 3 is a drawing, schematically illustrating a cross-sectional view of a part of the TFT relating to the source electrode and the drain electrode, according to an embodiment of the invention.

Referring to FIG. 3, the invention has looked into the issues to the structure about the source electrode 304 and the drain electrode 306 formed on the oxide semiconductor layer 302. The oxide semiconductor layer 302 can be formed over a substrate 300, on which another structure may have already formed thereon. The substrate 300 here represents a structural substrate, which is a part of the TFT in FIG. 1 or FIG. 2 to form the oxide semiconductor layer 302, the source electrode 304 and the drain electrode 306, as an example. A distance or a gap G1, as expected, is between the source electrode 304 and the drain electrode 306, used to define the channel length in the oxide semiconductor layer 302. However, the source electrode 304 and the drain electrode 306 made of metal nitride, such as TaN, may be easily oxidized into metal-nitride oxidation layer 308 at the exposed surface in the subsequent fabrication process. The metal-nitride oxidation layer 308 in an example is a native oxide layer, formed naturally, not by intended addition step, in an embodiment.

The metal-nitride oxidation layer 308 basically is inevitably formed. However, the thickness of the metal-nitride oxidation layer 308 may cause the shrinkage for the channel length from the gate G1 to the gap G2. The gap G1 usually is in a range of 30 nm to 80 nm, resulting into a high aspect ratio. The reduced gap G2 would reduce the channel length as expected in design. Further, the thickness of the metal-nitride oxidation layer 308 may increase the aspect ratio of the trench 310, causing higher aspect ratio. As a result, the subsequent structure, such as the gate electrode, is not easily filled into the trench 310, causing a certain level of defect. Even further, the formation of the metal-nitride oxidation layer 308 may consume the oxygen in the oxide semiconductor layer 302, reducing the performance of the channel of TFT.

In other words, the thickness of the metal-nitride oxidation layer 308 is intended to be reduced for fabricating the TFT.

After deeply looking into the issues, the invention proposes the modification to form the source electrode 304 and the drain electrode 306 by a condition to control the metal plasma by a power range of 5 kw to 15 kw and flashing $N_2$, to form the metal nitride layer, such as TaN. In the embodiment, the metal Ta in plasma chamber is provided by a power range of 5 kw to 15 kw. To form the metal nitride, the $N_2$ in an example is flashed by a range of 30 sccm to 50 sccm.

In the condition above to form the TaN, the bounding components of Ta—N can increase and then be more robust for the TaN layer, with less possibility to be oxidized. Then, the thickness of the metal-nitride oxidation layer 308 can be effectively reduced.

The invention has investigated the thickness of the metal-nitride oxidation layer 308 as formed in various operation conditions, and proposed the Ta plasma in the plasma chamber by the power range of 5 kw to 15 kw. Further, the $N_2$ in an example is flashed by a range of 30 sccm to 50 sccm.

Figure 4:
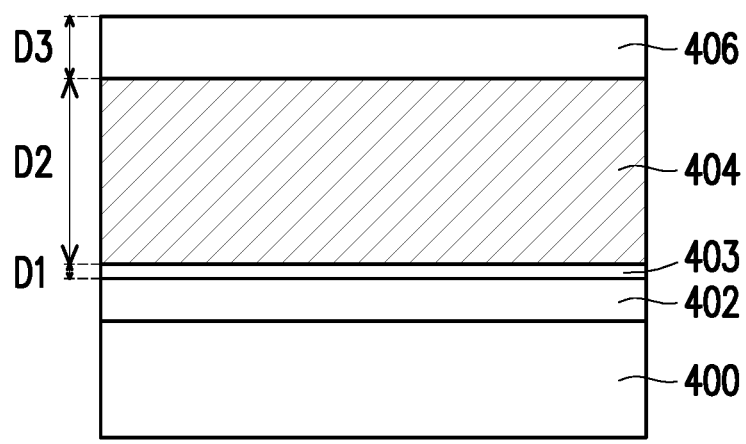
FIG. 4 is a drawing, schematically illustrating a stacked structure of a semiconductor device, according to an embodiment of the invention.

The invention is not limited to the application for forming the TFT and can be directed to the semiconductor stack structure as a part of any suitable device. FIG. 4 is a drawing, schematically illustrating a stacked structure of a semiconductor device, according to an embodiment of the invention. Referring to FIG. 4, the semiconductor device is directed to a stacked structure, or a sandwiched structure, including an oxide semiconductor layer 402 disposed on a substrate 400. A metal nitride layer 404 is disposed on the oxide semiconductor layer 402 and a metal-nitride oxidation layer 406 is disposed on the metal nitride layer 404. An oxidation layer 403 at the bottom of the metal nitride layer 404 has a thickness D1. The metal nitride layer 404 has a thickness of D2. The metal-nitride oxidation layer 406 has a thickness of D3.

As noted, during the process in forming the metal-nitride oxidation layer 406 on top of the metal nitride layer 404, an oxidation layer 403 may additionally be formed at the bottom of the metal nitride layer 404 due to the same oxidation process. The oxidation layer 403 in an example can be metal-nitride oxidation layer or tantalum-nitride oxidation layer. The thickness D1 of the oxidation layer 403 is relatively small, and is smaller than the thickness D3 of the metal-nitride oxidation layer 406. On the other hand, the metal-nitride oxidation layer 406, the metal nitride layer 404, and the oxidation layer 403 are in a stack structure, like a sandwich structure. In other words, the thickness D3 of the metal-nitride oxidation layer 406 is larger than the thickness D1 of the oxidation layer 403. This oxidation layer 403, likewise, occurs in other embodiments, such as the embodiments in FIGS. 1-3, in which the metal nitride layer 404 serves as the source electrode and the drain electrode.

From the structure point of view as controlled in the invention, in an example, a ratio of D3 to D2 is equal to or less than 0.2 as formed in the invention. Actually, the invention can reduce the thickness D3 of the metal-nitride oxidation layer 406, relatively from the metal nitride layer 404. In various verification samples, the thickness D3 can be reduced. The channel length, or the gate length, can still be maintained with significant shrinkage.

Figure 5:
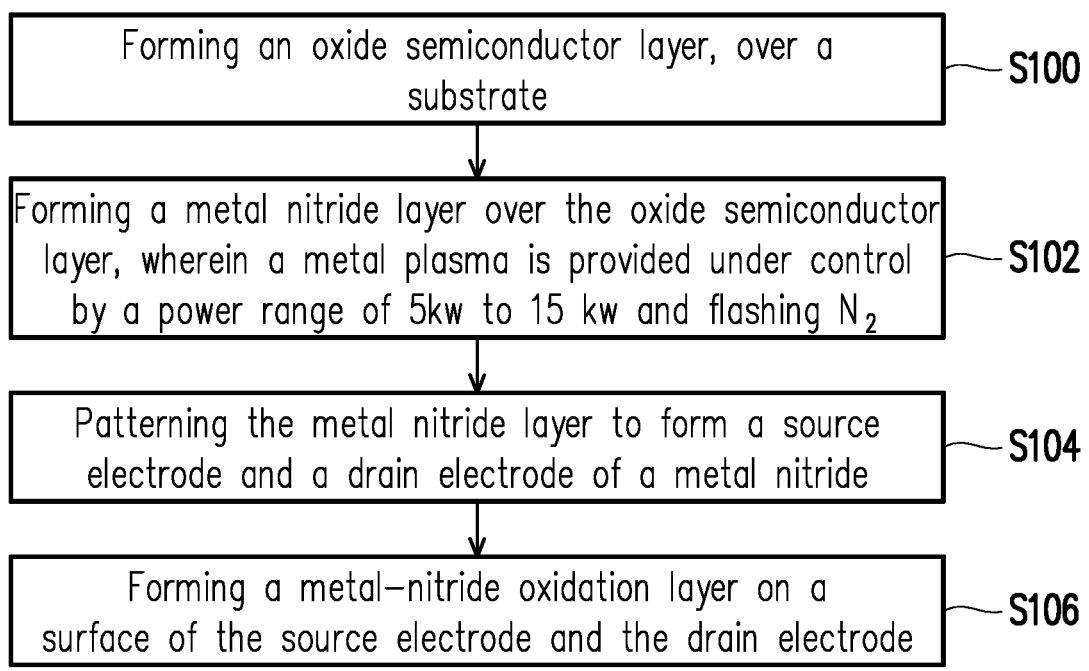
FIG. 5 is a drawing, schematically illustrating a flow of a method to fabricate a semiconductor device, according to an embodiment of the invention.

From the fabrication point of view, the invention also provides a method for fabricating a semiconductor device comprising several steps. FIG. 5 is a drawing, schematically illustrating a flow of a method to fabricate a semiconductor device, according to an embodiment of the invention. Referring to FIG. 5, in step S100, the method includes forming an oxide semiconductor layer, over a substrate. In step S102, the method includes forming a metal nitride layer over the oxide semiconductor layer, wherein a metal plasma is provided under control by a power range of 5 kw to 15 kw and flashing $N_2$. In step S104, the method includes patterning the metal nitride layer to form a source electrode and a drain electrode of a metal nitride. In step S106. The method includes forming a metal-nitride oxidation layer on an exposed surface of the source electrode and the drain electrode. Further still, the $N_2$ is flashed by a range of 30 sccm to 50 sccm.

The invention has properly controlled the power of the metal plasma chamber. The flash rate of $N_2$ may also be additionally controlled. As a result, the TaN is more robust or concrete, in which the quality of Ta—N bonding is in better condition. The possibility of oxidation on the metal nitride, such as TaN is reduced. As a result, the gate length can be possibly maintained without greatly reduced. In addition, the oxygen in the oxide semiconductor layer is not further consumed.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A semiconductor device, comprising:
    a first gate electrode, disposed over the substrate;
    a first insulating layer, disposed over the substrate and covering the first gate electrode;
    an oxide semiconductor layer, disposed on the first insulating layer;
    a source electrode of a metal nitride, disposed on the oxide semiconductor layer;
    a drain electrode of the metal nitride, disposed on the oxide semiconductor layer;
    a metal-nitride oxidation layer, formed on a surface of the source electrode and the drain electrode, and
    an oxidation layer at a bottom surface of the drain electrode and the source electrode in contact with the oxide semiconductor layer, wherein the thickness of the metal-nitride oxidation layer is larger than a thickness of the oxidation layer, wherein a ratio of a thickness of the metal-nitride oxidation layer to a thickness of the drain electrode or the source electrode is equal to or less than 0.2, wherein a distance between the source electrode and the drain electrode is in a range of 30 nm to 80 nm;

wherein the metal-nitride oxidation layer is a first native oxide layer of the source and drain electrode and the oxidation layer is a second native oxide layer of the source and drain.

2. The semiconductor device of claim 1, wherein the thickness of the metal-nitride oxidation layer is less than 7 nm.

3. The semiconductor device of claim 1, wherein the metal nitride is TaN.

4. The semiconductor device of claim 1, wherein the oxide semiconductor layer comprises InGaZnO (IGZO), In—Zn—O (IZO), In—Ga—O (IGO), Zn—Sn—O (ZTO), In—Sn—Zn—O (ITZO), Hf—In—Zn—O (HIZO), or Al—Zn—Sn—O (AZTO).

5. The semiconductor device of claim 1, wherein bonding components of metal-N in the metal nitride for the source electrode and the drain electrode are at a level to reduce formation of the metal-nitride oxidation layer.

6. The semiconductor device of claim 1, further comprising:
a second insulting layer, disposed on the source electrode, the drain electrode and a portion of the oxide semiconductor layer as exposed between the source electrode and the drain electrode; and
a second gate electrode, disposed on the second insulting layer at least over the portion of the oxide semiconductor layer as exposed.

7. The semiconductor device of claim 1, wherein a portion of a gate electrode is disposed between the source electrode and the drain electrode.

8. The semiconductor device of claim 1, wherein sidewalls of the source electrode and the drain electrode are straight and substantially perpendicular to the substrate.

* * * * *